United States Patent
Glavin et al.

(10) Patent No.: US 10,418,237 B2
(45) Date of Patent: Sep. 17, 2019

(54) AMORPHOUS BORON NITRIDE DIELECTRIC

(71) Applicant: Government of the United States, as represented by the Secretary of the Air Force, Wright-Patterson AFB, OH (US)

(72) Inventors: Nicholas Glavin, Beavercreek, OH (US); Chris Muratore, Dayton, OH (US); Timothy Fisher, West Lafayette, IN (US); Andrey Voevodin, Denton, TX (US)

(73) Assignee: United States of America as represented by the Secretary of the Air Force, Wright Patterson AFB, OH (US)

( * ) Notice: Subject to any disclaimer, the term of this patent is extended or adjusted under 35 U.S.C. 154(b) by 0 days.

(21) Appl. No.: 15/820,803

(22) Filed: Nov. 22, 2017

(65) Prior Publication Data

US 2018/0144930 A1    May 24, 2018

Related U.S. Application Data

(60) Provisional application No. 62/425,657, filed on Nov. 23, 2016.

(51) Int. Cl.
*H01L 21/02* (2006.01)
*B82B 1/00* (2006.01)
(Continued)

(52) U.S. Cl.
CPC ........ *H01L 21/02172* (2013.01); *B82B 1/002* (2013.01); *B82B 1/008* (2013.01);
(Continued)

(58) Field of Classification Search
CPC ............ H01L 29/0665; H01L 29/2006; H01L 21/02172; B82B 1/002; B82B 1/008; B82B 3/009; B82B 3/0023; B82B 3/0038
See application file for complete search history.

(56) References Cited

U.S. PATENT DOCUMENTS 8,380,327 B2 *  2/2013  Park .................. G05B 11/01
                                                  29/592.1
8,442,254 B2 *  5/2013  Yu .................... H04R 1/025
                                                  381/334

(Continued)

OTHER PUBLICATIONS

Glavin et al, "Amorphous boron nitride: Universal, Ultrathin Dielectric for 2D Nanoelectronic", Advanced Functional Materials, 2016, 26, pp. 2640-2647.*

(Continued)

*Primary Examiner* — Thanhha S Pham
(74) *Attorney, Agent, or Firm* — AFMCLO/JAZ; James McBride

(57) ABSTRACT

A nanoelectronics structure is disclosed which includes a substrate layer which has least a first surface and also has a thickness of less than 100 nm. The nanoelectronics structure also includes a dielectric layer, which is deposited on the first surface of the substrate layer and has a thickness of less than 100 nm. This dielectric layer is made up of at least 90 mole percent amorphous boron nitride. Also disclosed is a method for forming a dielectric layer on a substrate using pulsed laser deposition.

10 Claims, 3 Drawing Sheets

(51) Int. Cl.
  *B82B 3/00* (2006.01)
  *H01L 29/20* (2006.01)
  *H01L 29/16* (2006.01)
  *H01L 29/06* (2006.01)
(52) U.S. Cl.
  CPC .......... *B82B 3/0023* (2013.01); *B82B 3/0038* (2013.01); *H01L 21/02112* (2013.01); *H01L 21/02266* (2013.01); *H01L 29/2006* (2013.01); *H01L 29/0665* (2013.01); *H01L 29/1606* (2013.01)

(56) References Cited

U.S. PATENT DOCUMENTS

| | | | | |
|---|---|---|---|---|
| 8,442,600 B1* | 5/2013 | Tseng | G06F 1/1637 | 455/575.4 |
| 8,482,712 B2* | 7/2013 | Shinn | G02F 1/167 | 349/158 |
| 8,507,123 B2* | 8/2013 | Kwon | H01M 2/0275 | 429/127 |
| 8,525,059 B2* | 9/2013 | Berger | A61C 1/0007 | 607/89 |
| 8,557,637 B2* | 10/2013 | Chen | H01L 51/003 | 438/113 |
| 8,653,392 B2* | 2/2014 | Berger | A61C 1/0007 | 200/512 |
| 8,678,293 B2* | 3/2014 | Chen | G06K 19/0723 | 235/492 |
| 8,753,763 B2* | 6/2014 | Kwon | H01M 2/0275 | 429/127 |
| 8,777,116 B2* | 7/2014 | Lin | G06K 19/0701 | 235/379 |
| 8,804,993 B2* | 8/2014 | Shukla | B29C 45/1671 | 381/189 |
| 8,929,085 B2* | 1/2015 | Franklin | G06F 1/1626 | 361/749 |
| 8,969,735 B2* | 3/2015 | Chow | H01L 23/49811 | 174/261 |
| 8,975,534 B2* | 3/2015 | Lai | H05K 1/189 | 174/258 |
| 9,035,016 B2* | 5/2015 | Seferos | C08G 73/0677 | 252/301.16 |
| 9,159,635 B2* | 10/2015 | Elolampi | H01L 23/13 | |
| 9,228,907 B2* | 1/2016 | Salo | G01L 1/04 | |
| 9,237,389 B2* | 1/2016 | Yu | H04R 1/025 | |
| 9,247,653 B2* | 1/2016 | Chen | H05K 3/361 | |
| 9,274,562 B2* | 3/2016 | Franklin | G06F 1/1626 | |
| 9,320,419 B2* | 4/2016 | Kirnna | A61B 1/00091 | |
| 9,338,893 B2* | 5/2016 | Huang | H05K 3/281 | |
| 9,345,131 B2* | 5/2016 | Peng | H05K 1/028 | |
| 9,388,278 B2* | 7/2016 | Lin | C08G 73/1067 | |
| 9,401,306 B2* | 7/2016 | Mahajan | H01L 21/76879 | |
| 2012/0033353 A1* | 2/2012 | Huang | G09F 9/33 | 361/679.01 |
| 2012/0115259 A1* | 5/2012 | Lee | H01M 10/052 | 438/19 |
| 2012/0211355 A1* | 8/2012 | Choi | C23C 14/08 | 204/192.29 |
| 2012/0262367 A1* | 10/2012 | Chiu | G06F 1/1626 | 345/156 |
| 2012/0318771 A1* | 12/2012 | Guo | G02F 1/133305 | 216/20 |
| 2013/0081127 A1* | 3/2013 | Chen | G06Q 20/341 | 726/9 |
| 2013/0098754 A1* | 4/2013 | Choi | C23C 14/08 | 204/192.29 |
| 2013/0100392 A1* | 4/2013 | Fukushima | G09F 9/30 | 349/150 |
| 2013/0105203 A1* | 5/2013 | Lee | H01L 51/003 | 174/254 |
| 2013/0115426 A1* | 5/2013 | Fang | H01L 27/1266 | 428/156 |
| 2013/0131887 A1* | 5/2013 | Park | G05B 11/01 | 700/303 |
| 2013/0153030 A1* | 6/2013 | Accardi | H01L 31/0481 | 136/259 |
| 2013/0188324 A1* | 7/2013 | Lee | H01L 27/1218 | 361/750 |
| 2013/0271588 A1* | 10/2013 | Kirma | A61B 1/00091 | 348/76 |
| 2013/0277239 A1* | 10/2013 | Hutchinson | A45C 11/00 | 206/45.23 |
| 2013/0321373 A1* | 12/2013 | Yoshizumi | G09G 5/00 | 345/211 |
| 2013/0333094 A1* | 12/2013 | Rogers | A61B 5/01 | 2/161.7 |
| 2014/0082980 A1* | 3/2014 | Sherman | G09F 3/0295 | 40/316 |
| 2014/0110274 A1* | 4/2014 | Lestelius | C09D 11/52 | 205/793 |
| 2014/0145139 A1* | 5/2014 | Huang | H01L 51/0591 | 257/4 |
| 2014/0176428 A1* | 6/2014 | Hsieh | G06F 1/1652 | 345/156 |
| 2014/0176429 A1* | 6/2014 | Hsieh | G06F 1/1652 | 345/156 |
| 2014/0228512 A1* | 8/2014 | Chou | C09D 179/08 | 524/600 |
| 2014/0250687 A1* | 9/2014 | Zhang | G06F 1/1652 | 29/846 |
| 2014/0268532 A1* | 9/2014 | Nicol | G09F 9/301 | 361/679.26 |
| 2014/0301026 A1* | 10/2014 | Liu | G06F 1/1613 | 361/679.01 |
| 2015/0001519 A1* | 1/2015 | Matsuura | H01L 33/38 | 257/40 |
| 2015/0018659 A1* | 1/2015 | Ware | A61B 5/04001 | 600/378 |
| 2015/0029229 A1* | 1/2015 | Voutsas | G06F 1/1652 | 345/661 |
| 2015/0036257 A1* | 2/2015 | Cheng | G06F 1/1652 | 361/220 |
| 2015/0046297 A1* | 2/2015 | Bahrami | G06F 3/0485 | 705/27.2 |
| 2015/0048715 A1* | 2/2015 | Zhou | H02N 1/08 | 310/300 |
| 2015/0062840 A1* | 3/2015 | Kim | G06F 1/1652 | 361/749 |
| 2015/0073072 A1* | 3/2015 | Kim | H01B 3/447 | 524/106 |
| 2015/0081478 A1* | 3/2015 | Bahrami | G06F 3/0485 | 705/27.1 |
| 2015/0083473 A1* | 3/2015 | Downs | H05K 1/0366 | 174/257 |
| 2015/0098891 A1* | 4/2015 | Song | C01B 32/194 | 423/448 |
| 2015/0129280 A1* | 5/2015 | Lee | H01M 4/133 | 174/126.2 |
| 2015/0138736 A1* | 5/2015 | Catchpole | G06F 1/1652 | 361/749 |
| 2015/0189736 A1* | 7/2015 | Yang | H05K 1/028 | 361/749 |
| 2015/0201694 A1* | 7/2015 | Boyce | A42B 3/046 | 340/539.12 |
| 2015/0224530 A1* | 8/2015 | Sugimoto | B05C 1/0873 | 118/664 |
| 2015/0227245 A1* | 8/2015 | Inagaki | G06F 3/0412 | 345/173 |
| 2015/0277498 A1* | 10/2015 | Wu | G06F 1/1652 | 345/173 |
| 2015/0289378 A1* | 10/2015 | Jung | B32B 15/04 | 174/250 |
| 2015/0307730 A1* | 10/2015 | Hersam | C09D 11/52 | 430/308 |
| 2015/0322223 A1* | 11/2015 | Woo | C08G 18/8025 | 428/336 |
| 2015/0324756 A1* | 11/2015 | Hughes | G06Q 10/1095 | 705/7.19 |

(56) References Cited

U.S. PATENT DOCUMENTS

| | | | | |
|---|---|---|---|---|
| 2015/0342036 A1* | 11/2015 | Elolampi | ............... | H01L 23/13 174/254 |
| 2015/0378391 A1* | 12/2015 | Huitema | ............... | G06F 1/163 361/679.03 |
| 2015/0382474 A1* | 12/2015 | Liu | ............... | B32B 7/12 29/832 |
| 2016/0014403 A1* | 1/2016 | Stroetmann | ............... | H04N 13/122 348/53 |
| 2016/0014912 A1* | 1/2016 | Shih | ............... | H05K 3/30 362/97.1 |
| 2016/0014914 A1* | 1/2016 | Stroetmann | ............... | G06F 1/1616 312/223.1 |
| 2016/0014919 A1* | 1/2016 | Huitema | ............... | G06F 1/1652 313/511 |
| 2016/0034104 A1* | 2/2016 | Lee | ............... | H01L 27/1218 345/173 |
| 2016/0037625 A1* | 2/2016 | Huitema | ............... | H05K 1/028 361/749 |
| 2016/0037633 A1* | 2/2016 | Downs | ............... | B32B 5/12 361/749 |
| 2016/0040027 A1* | 2/2016 | Woo | ............... | B32B 5/024 428/336 |
| 2016/0046103 A1* | 2/2016 | Hong, II | ............... | B32B 17/064 428/336 |
| 2016/0057835 A1* | 2/2016 | Wang | ............... | H05B 33/26 313/503 |
| 2016/0071756 A1* | 3/2016 | Moore | ............... | H01L 21/6835 269/289 R |
| 2016/0109985 A1* | 4/2016 | Salo | ............... | G01L 1/04 345/174 |
| 2016/0111588 A1* | 4/2016 | Accardi | ............... | H01L 31/0481 438/127 |
| 2016/0135286 A1* | 5/2016 | Hwang | ............... | H05K 1/189 361/720 |
| 2016/0143130 A1* | 5/2016 | Wu | ............... | H05K 1/028 361/749 |
| 2016/0155965 A1* | 6/2016 | Kusuura | ............... | H01L 51/0024 361/749 |
| 2016/0163537 A1* | 6/2016 | Tanaka | ............... | H01L 21/02172 257/79 |
| 2016/0179253 A1* | 6/2016 | Franklin | ............... | G06F 1/1626 345/174 |
| 2016/0192478 A1* | 6/2016 | Kuo | ............... | H05K 1/0281 361/749 |
| 2016/0192501 A1* | 6/2016 | Yan | ............... | H01L 29/0673 29/846 |
| 2016/0200254 A1* | 7/2016 | Raab | ............... | B60R 1/00 348/148 |
| 2016/0211473 A1* | 7/2016 | Van Den Ende | .... | H05K 1/0283 |
| 2016/0218320 A1* | 7/2016 | Chen | ............... | H01L 51/5256 |
| 2016/0231784 A1* | 8/2016 | Yu | ............... | G02F 1/133305 |

OTHER PUBLICATIONS

Nicholas R. Glavin, Christopher Muratore, Michael L. Jespersen, Jianjun Hu, Timothy S. Fisher & Andrey A. Voevodin; Temporally and spatially resolved plasma spectoscopy in pulsed laser deposition of ultra-thin boron nitride films; Journal of Applied Physics 117, 165305 (2015); published by the American Institute of Physics.

Nicholas R. Glavin, Michael L. Jespersen, Michael H. Check, Jianjun Hu, Al M. Hilton, Timothy S. Fisher, Andrey Voevodin; Synthesis of few-layer, large area hexagonal-boron nitride by pulsed laser deposition; Thin Solid Films 572 (2014) 245-250.

* cited by examiner

AMORPHOUS BORON NITRIDE DIELECTRIC

CROSS REFERENCE TO RELATED APPLICATIONS

The application claims the benefit of the earlier filing date of U.S. provisional application No. 62/425,657, filed Nov. 23, 2016, the entire contents of which are herein incorporated by reference.

GOVERNMENT INTEREST

The invention described herein may be manufactured, used, and licensed by or for the Government of the United States for all governmental purposes without the payment of any royalty.

FIELD OF THE INVENTION

The present disclosure relates to nanoelectronic structures and more specifically to ultrathin dielectric materials for two-dimensional nanoelectronic structures.

BACKGROUND OF THE INVENTION

Ultrathin materials made up of only a single layer of atoms are sometimes referred to as two-dimensional (2D) or single layer materials. Applications for 2D materials and their heterostructures in fields such as communications, high speed computing, sensing, and energy harvesting are currently limited by the absence of direct and repeatable synthesis methods for cost effective device fabrication. While conducting (e.g., graphene, $TaS_2$), and semiconducting (e.g., $MoS_2$, $WS_2$) 2D materials are being rapidly advanced for next-generation 2D devices, ultrathin and high strength dielectric materials for transistor gates, capacitors, memory devices, and barrier layers for electrical and ambient environment isolation are far less developed.

This circumstance is primarily a result of the fundamental challenge in synthesis of ultrathin insulating materials at moderate temperatures (generally less than 900° C.) needed for direct growth over large lateral dimensions. In silicon-based electronics, silicon dioxide ($SiO_2$), prepared by plasma enhanced chemical vapor deposition (PECVD), has proven to be a suitable dielectric material due to the large band gap (9 eV), well-matched interfacial properties with silicon, and simple, repeatable processing. However, there is a continuing desire to develop additional ultrathin dielectric materials which unique 2D benefits such as optical transparency and mechanical flexibility, for use in flexible electronic devices and other premium areas of nanotechnology innovation. Attempts to provide suitable ultrathin dielectric alternatives have included Atomic Layer Deposition (ALD) of $HfO_2$ and $Al_2O_3$ and thermal activated growth of crystalline hexagonal form boron nitride (h-BN) by chemical vapor deposition (CVD). To date, however, such ultrathin dielectrics have been found to suffer from significant scaling, process tuning, and pinhole-free uniformity challenges.

Thus, there is a continuing need to further develop ultrathin, 2D dielectric materials which do not suffer from the aforementioned difficulties.

SUMMARY OF THE INVENTION

In response to these issues, the present disclosure provides, in a first aspect, a nanoelectronics structure. In accordance with one embodiment of the present disclosure, this nanoelectronics structure includes a substrate layer which has least a first surface and also has a thickness of less than 100 nm. The nanoelectronics structure also includes a dielectric layer, which is deposited on the first surface of the substrate layer and has a thickness of less than 100 nm. This dielectric layer is made up of at least 90 mole percent amorphous boron nitride (α-BN).

In certain embodiments of the nanoelectronics structure, the dielectric layer is preferably made up of at least 95 mole percent amorphous boron nitride.

In certain embodiments of the nanoelectronics structure, the substrate layer is preferably made up of a material selected from the group consisting of silicon substrates, silicon oxide substrates, single-crystalline substrates, polycrystalline substrates, polymer substrates, metal substrates, and two-dimensional substrates. For example, in some embodiments, the substrate layer is preferably made up of a material selected from the group consisting of tungsten, copper, silicon dioxide ($SiO_2$), aluminum oxide ($Al_2O_3$), molybdenum disulfide ($MoS_2$), graphene, polyethylene terephthalate (PET), and polydimethylsiloxane (PDMS). Further, in certain embodiments, the substrate layer preferably has a thickness of less than 20 nm.

Further, in certain embodiments of the nanoelectronics structure, the dielectric layer preferably has a thickness of less than 20 nm. More preferably, the dielectric layer has a thickness of less than 10 nm.

In some embodiments of the nanoelectronics structure, the dielectric layer preferably exhibits a dielectric constant from about 5.2 to about 6.6.

In certain embodiments of the nanoelectronics structure, the dielectric layer preferably exhibits a bandgap from about 4.0 eV to about 5.0 eV. More preferably, the dielectric layer exhibits a bandgap from about 4.3 eV to about 4.7 eV.

In certain embodiments of the nanoelectronics structure, the dielectric layer preferably functions as a thermal barrier layer. However, in some other embodiments of the nanoelectronics structure, the dielectric layer preferably functions as an environmental protection layer.

In a second aspect, the present disclosure provides a method for forming a dielectric layer on a substrate by pulsed laser deposition. In accordance with one embodiment of the present disclosure, this method includes providing at least one target made up of boron nitride. A substrate, having at least a first surface and having a thickness of less than 100 nm, is positioned so that the distance from the target to the first surface of the substrate is from about 0.1 cm to about 10 cm. The target is then irradiated with a pulsed laser so as to ablate and vaporize at least a portion of the boron nitride. At least a portion of the vaporized boron nitride is condensed on the first surface of the substrate so as to deposit a dielectric layer on the first surface of the substrate layer. This dielectric layer has a thickness of less than 100 nm and is made up of at least about 90 mole percent amorphous boron nitride.

In certain embodiments of the method, the target and the substrate are preferably positioned within a pressure vessel and the interior of the pressure vessel is maintained at a pressure of less than 100 mTorr during the irradiating and condensing steps. More preferably in some embodiments, the target and the substrate are positioned within a pressure vessel and the interior of the pressure vessel is maintained at a pressure from about 25 mTorr to about 75 mTorr during the irradiating and condensing steps.

Further, in some embodiments of the method, the target and the substrate are preferably positioned within a pressure vessel and an inert atmosphere, comprising less than about 1.0 mole percent oxygen, is maintained within the interior of the pressure vessel during the irradiating and condensing steps.

In certain embodiments of the method, the substrate preferably is maintained at a temperature of less than 200° C. during the irradiating and condensing steps.

In some embodiments of the method, the target is preferably positioned so that the distance from the target to the first surface of the substrate from about 1 cm to about 5 cm.

In certain embodiments of the method, the pulsed laser preferably irradiates the target with electromagnetic energy having a wavelength from about 150 nm to about 350 nm. Further, in some embodiments of the method, the pulsed laser irradiates the target with electromagnetic energy having an energy intensity of at least 1 J/cm$^2$. More preferably, the pulsed laser irradiates the target with electromagnetic energy having an energy intensity of at least 10 J/cm$^2$.

In a third aspect, the present disclosure provides a nanoelectronics structure which includes a substrate layer having at least a first surface and having a thickness of less than 20 nm and a dielectric layer deposited on the first surface of the substrate layer and having a thickness of less than 20 nm. The substrate layer is made up of a two-dimensional substrate material selected from the group consisting of molybdenum disulfide (MoS2) and graphene. The dielectric layer is made up of at least 90 mole percent amorphous boron nitride.

BRIEF DESCRIPTION OF THE DRAWINGS

Other embodiments of the invention will become apparent by reference to the detailed description in conjunction with the figures, wherein elements are not to scale so as to more clearly show the details, wherein like reference numbers indicate like elements throughout the several views, and wherein.

DETAILED DESCRIPTION OF THE INVENTION

In a first aspect, the present disclosure provides novel ultrathin dielectric materials and two-dimensional (2D) nanoelectronic structures incorporating such ultrathin dielectric materials.

Figure 1:
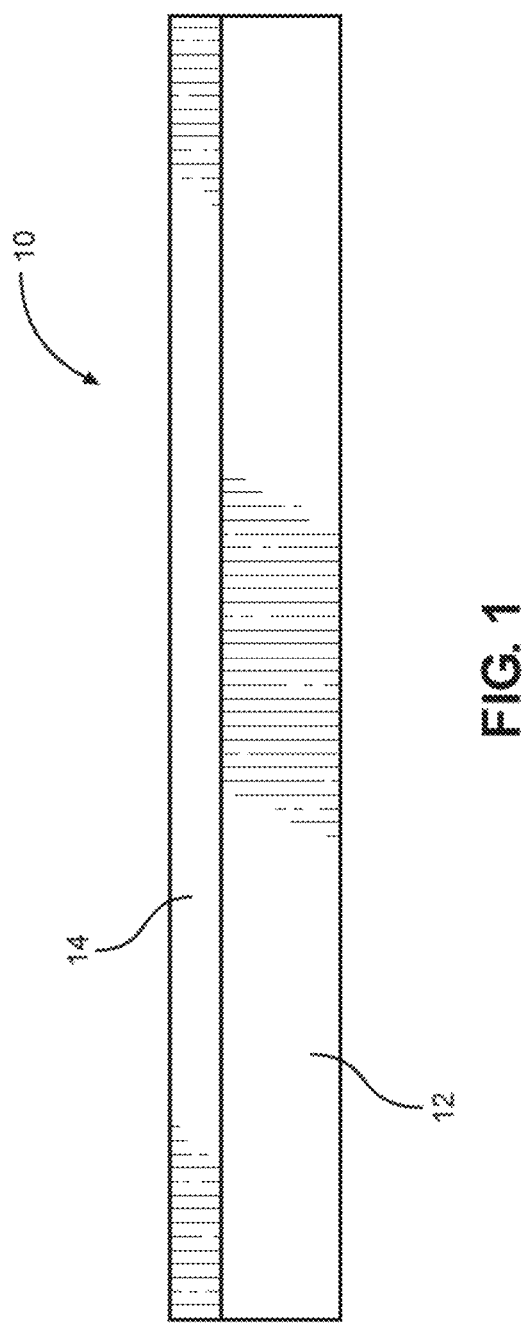
FIG. 1. is a schematic elevational view of a nanoelectronics structure according to one embodiment of the present disclosure.

As shown in FIG. 1, in one embodiment, the nanoelectronic structure 10 includes at least a substrate layer 12 and a dielectric layer 14. The substrate layer 12 includes at least a first surface 16 and the dielectric layer 14 is deposited on this first surface 16 of the substrate layer 12.

The substrate layer 12 may be formed from any of a wide variety of conductive or semi-conductive materials suitable for inclusion in small scale electronics. In general, the substrate layer 12 may be made up of a material selected from the group consisting of silicon substrates, silicon oxide substrates, single-crystalline substrates, poly-crystalline substrates, polymer substrates, metal substrates, and two dimensional substrates. More particularly, in some embodiments according to the present disclosure, the substrate layer 12 is preferably made up of a material selected from the group consisting of tungsten, copper, silicon dioxide ($SiO_2$), aluminum oxide ($Al_2O_3$), molybdenum disulfide ($MoS_2$), graphene, polyethylene terephthalate (PET), and polydimethylsiloxane (PDMS). Most preferably, the substrate layer 12 is made up of a two-dimensional substrate material.

In general, the substrate layer 12 is an ultrathin material having a thickness which is less than 100 nm. More preferably, the substrate layer 12 has a thickness of less than 20 nm.

A dielectric layer 14 is deposited on the first surface 16 of the substrate layer 12. Like the substrate layer 12, the dielectric layer 14 has a thickness which is less than 100 nm. More preferably, the dielectric layer 14 has a thickness of less than 20 nm, and most preferably the dielectric layer 14 has a thickness of less than 10 nm. Thus, the dielectric layer 14 is preferably made up of no more than a few layers of atoms (most preferably only a single layer of atoms) and may be referred to as two-dimensional.

The dielectric layer 14 according to the present disclosure is principally made up of boron nitride (BN), and importantly, the boron nitride in the dielectric layer 14 is principally in the amorphous form. Preferably, the dielectric layer 14 is made up of at least 90 mole percent amorphous boron nitride ($\alpha$-BN). More preferably, the dielectric layer 14 is preferably made up of at least 95 mole percent amorphous boron nitride.

This amorphous boron nitride has been found to exhibit excellent dielectric properties. For instance, the amorphous boron nitride preferably exhibits a dielectric constant from about 5.2 to about 6.6. More preferably, the dielectric layer 14 exhibits a dielectric constant of about 5.9. In other experiments, the bandgap of the dielectric layer 14 was tested. In general, the dielectric layer 14 preferably exhibits a bandgap from about 4.0 eV to about 5.0 eV. More preferably, the dielectric layer 14 exhibits a bandgap from about 4.3 eV to about 4.7 eV, and most preferably about 4.5 eV. These dielectric properties are summarized below in Table 1, and also compared to properties of other thin film forms of BN:

TABLE 1

Dielectric properties of thin film $\alpha$-BN, CVD deposited h-BN, single crystal h-BN, and ultrathin $\alpha$-BN.

| Property | Thin film $\alpha$-BN (>600 nm) | CVD h-BN** | Single crystal h-BN | Ultrathin $\alpha$-BN (present invention) |
|---|---|---|---|---|
| Density | 2.28 | — | 2.0-2.28 | — |
| Dielectric constant | ≈3.5 | 3 ± 1.0 | 6.85 | 5.9 ± 0.7 |

TABLE 1-continued

Dielectric properties of thin film α-BN, CVD deposited h-BN, single crystal h-BN, and ultrathin α-BN.

| Property | Thin film α-BN (>600 nm) | CVD h-BN** | Single crystal h-BN | Ultrathin α-BN (present invention) |
|---|---|---|---|---|
| Dielectric strength (MV/cm) | 2.2-5.0 | 2-3.8 | 7.9-12 (exfoliated) | 9.8 ± 1.0 |
| Bandgap (eV) | 3.8-5.05 | 5.92 | 5.2-5.9 | 4.5 |
| Direct growth synthesis temperature & compatibility | Typically 200-600° C., by-product of desired c-BN synthesis | CVD at >900° C., refractory metal foils and some insulators | Exfoliation required to create ultra-thin layers | <200° C., compatible with wide range of substrates |

**= Measured dielectric constant and strength of CVD h-BN of thickness ≈ 15-19 nm.

For further comparison, silicon dioxide ($SiO_2$) grown by the thermal decomposition of silicon at a temperature greater than 700° C. typically exhibits a density of about 2.27, a dielectric constant of about 3.9, dielectric strength of about 9 MV, and a bandgap of 9 eV.

Moreover, the aforementioned dielectric properties of the amorphous boron nitride according to the present disclosure are substantially the same, without respect to the makeup of the substrate layer upon which the dielectric layer 14 has been applied.

Advantageously, the amorphous boron nitride dielectric layer 14 according to the present disclosure may be suitably utilized in a variety of nanoelectronics structures. For instances, in some embodiments of the nanoelectronics structure 10, the dielectric layer 14 may function as a thermal barrier layer. However, in some other embodiments of the nanoelectronics structure 10, the dielectric layer 14 may function as an environmental protection layer.

According to the present disclosure, the dielectric layer is preferably formed on the substrate layer by a pulsed laser deposition method. In summary, according to this method, an initial boron nitride target is provided. A substrate is positioned near the target, and the target is then irradiated with a pulsed laser so as to ablate and vaporize at least a portion of the boron nitride. At least a portion of the vaporized boron nitride is condensed on the first surface of the substrate so as to deposit a dielectric layer on the first surface of the substrate layer.

Figure 2A:
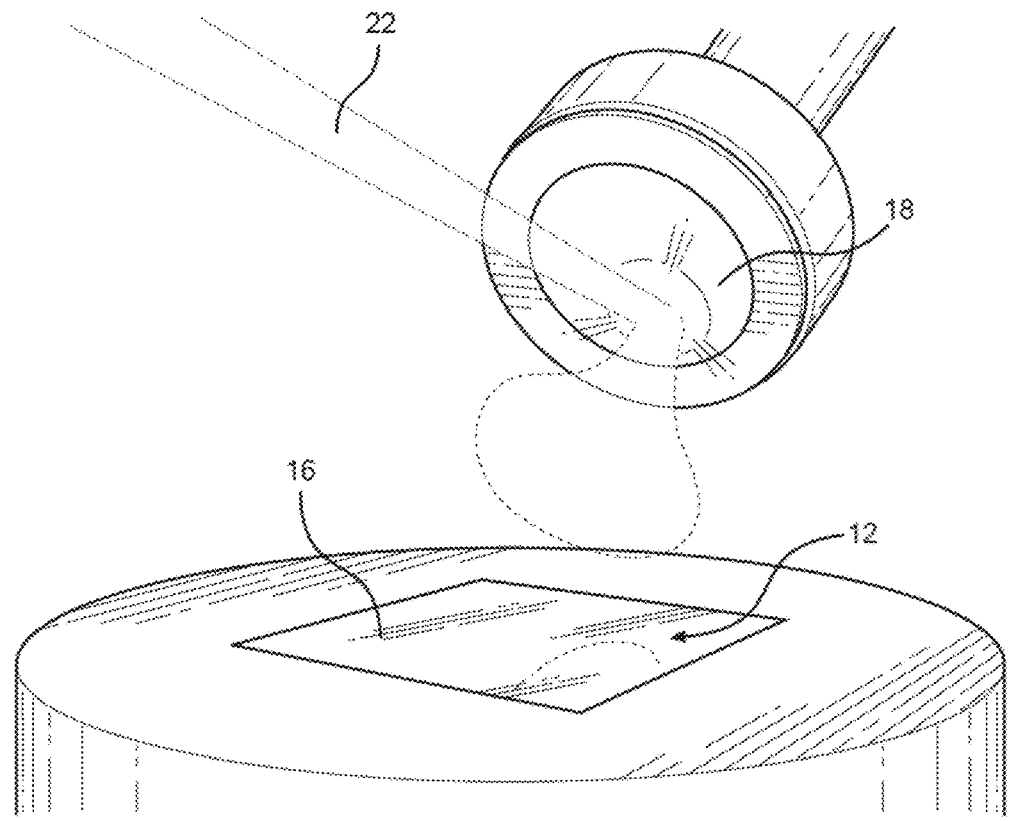
FIG. 2a. is a perspective view of a pulsed laser deposition system for use according to one embodiment of the present disclosure.

Thus, according to the present disclosure, a boron nitride (BN) target 18 is initially provided, as shown in FIG. 2a. The target 18 may be provided as a circular disc or square or rectangular article, having at least one generally flat surface upon which a laser may be focused. The surface area upon which a laser focused from about 1 $mm^2$ to about 100 $mm^2$ in size. At least the outer surface of this target 18 is made up of highly purified boron nitride. In some instances, the boron nitride target 18 may be rotated while being laser irradiated.

A substrate 12 is also provided. The substrate 12 has a first surface 16 upon which the boron nitride dielectric is to be deposited. As described above, the substrate 12 may be made up of a material selected from the group consisting of silicon substrates, silicon oxide substrates, single-crystalline substrates, poly-crystalline substrates, polymer substrates, metal substrates, and two dimensional substrates. For instance, the substrate 12 may be made up of a material selected from the group consisting of tungsten, copper, silicon dioxide ($SiO_2$), aluminum oxide ($Al_2O_3$), molybdenum disulfide ($MoS_2$), graphene, polyethylene terephthalate (PET), and polydimethylsiloxane (PDMS). In general, the substrate layer 12 is an ultrathin material having a thickness which is less than 100 nm. More preferably, the substrate layer 12 has a thickness of less than 20 nm.

Importantly, according to the present disclosure, the substrate 12 is positioned close to the target 18. Specifically, the substrate 12 is positioned so that the distance from the target 18 to the first surface 16 of the substrate is from about 0.1 cm to about 10 cm. More preferably, the target 18 is positioned so that the distance from the target 18 to the first surface 16 of the substrate 12 is from about 1 cm to about 5 cm. Most preferably, the target 18 is positioned so that the distance from the target 18 to the first surface 16 of the substrate 12 is about 3 cm.

Figure 2B:
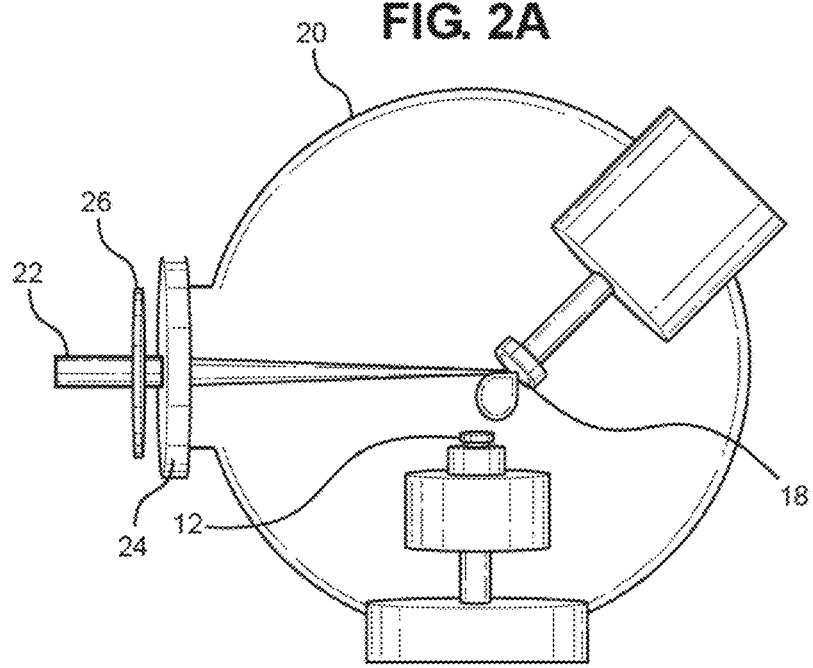
FIG. 2b. is a perspective view of a pulsed laser deposition system for use according to another embodiment of the present disclosure.

Preferably, at least the target 18 and the substrate 12 are positioned within a pressure vessel 20, as illustrated in FIG. 2b. Oxygen and other gases which might react with the boron nitride may then be removed from the interior of the pressure vessel 20 prior to irradiation of the target 18. In some instances, the interior of the pressure vessel 20 is maintained at a pressure of less than 100 mTorr during the irradiating and condensing steps. More preferably the interior of the pressure vessel 20 is maintained at a pressure from about 25 mTorr to about 75 mTorr, and most preferably at a pressure of about 50 mTorr.

Moreover, even at these reduced pressures, it is generally preferably that an inert atmosphere, comprising less than 1.0 mole percent oxygen, may be maintained within the interior of the pressure vessel 20 during the irradiating and condensing steps. Preferably, the inert atmosphere within the pressure vessel 20 is made up of at least 99 mole percent nitrogen ($N_2$) or another inert gas. More preferably, the inert atmosphere within the pressure vessel 20 is made up of at least 99.99 mole percent nitrogen ($N_2$) or another inert gas.

With the target 18 and substrate properly positioned, the target 18 is then irradiated with a pulsed laser 22 so as to ablate and vaporize at least a portion of the boron nitride. The pulsed laser 22 is preferably generated from a device positioned outside of the pressure vessel 20 and a glass or quartz window 24 is used to allow laser to irradiate the target 18 positioned within the pressure vessel 20. The laser 22 may also pass through a focusing lens 26 prior to irradiating the target 18.

The pulsed laser 22 used for this purpose is preferably a Krypton Fluoride (KrF) or similar laser, capable of irradiating the target 18 with electromagnetic energy having a wavelength from about 150 nm to about 350 nm. More preferably, the target 18 is irradiated with electromagnetic energy having a wavelength of 248 nm. The laser is generally pulsed at a rate from about 0.1 to about 10 Hz, preferably about 1 Hz. With each pulse, the laser 22 strikes the irradiated portion of the target 18 with electromagnetic energy having an energy intensity of at least 1 $J/cm^2$. More preferably, the pulsed laser 22 irradiates the target 18 with electromagnetic energy having an energy intensity of at least 10 J/cm2. Even more preferably, the pulsed laser 22 irradiates the target 18 with electromagnetic energy having an energy intensity of at least 10 J/cm$^2$ and up to 30 J/cm$^2$.

Again, the pulsed laser is used to ablate and vaporize at least a portion of the boron nitride target 18. At least a portion of the vaporized boron nitride is then condensed on the first surface 16 of the substrate so as to deposit a dielectric layer 14 on the first surface 16 of the substrate layer 12.

Significantly, according to the present disclosure, the substrate 12 is preferably maintained at a temperature of less than 200° C. during the irradiating and condensing steps. This is in contrast to conventional methods for dielectric layer formation such as chemical vapor deposition which typically require the substrate to be heated to much hotter temperatures (typically in excess of 900° C.) in order to provide satisfactory crystallographic structure or bonding between the dielectric and the substrate.

Further still, it has advantageously been found that the method of the present disclosure provides good deposition of the amorphous boron nitride dielectric layer 14 and good bonding between the dielectric layer 14 and the substrate layer 12 for each of the aforementioned substrates. Thus, the method may be employed without the need to substantially retune the laser deposition operating parameters (wavelength, intensity, distance from target to substrate, etc.) for each different substrate.

Without being bound by theory, it is believed that the nonequilibrium, localized heating of the target surface with the laser beam rapidly vaporizes boron and nitrogen species and in so doing, a high energy plasma is formed. Spectroscopic studies indicate that the plasma flux extending from the target is composed of ionized boron (B$^+$), ionized nitrogen (N$^+$), neutral excited nitrogen (N*), and a relatively smaller presence of molecular species including N2, N$^+$, and BN. The concentrations and time dependent peak occurrences of these species are controlled by laser power density, background gas pressure and the separation, or "working", distance from target to substrate. A combination of the latter two parameters is believed to define the collisional deceleration of the plasma species ablated from the BN target, altering the species' energies and timescales of interactions within the plasma before their arrival to the condensation surface.

Figures 3A, 3B:
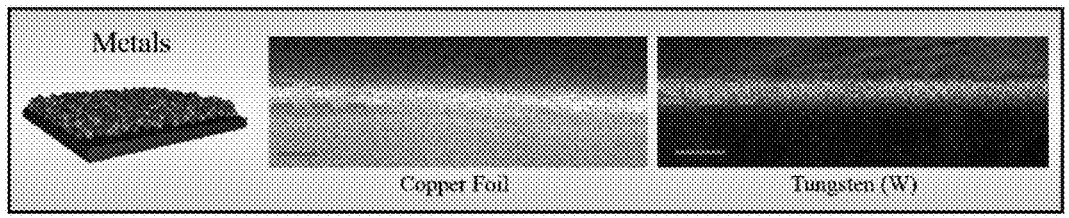
FIGS. 3a-3h are transmission electron microscopy (TEM) microphotographs showing dielectric layers of amorphous boron nitride deposited on various substrates according to the present disclosure.
Figures 3C, 3D:
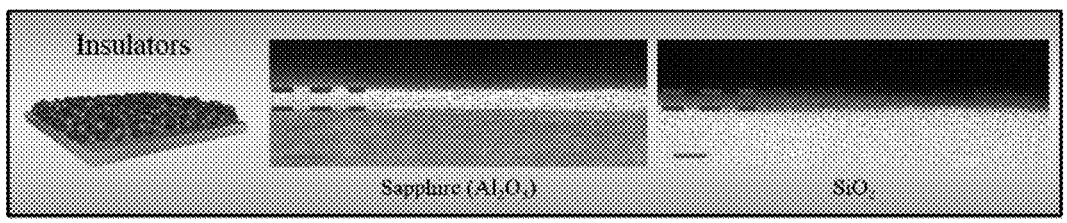
Figures 3E, 3F:
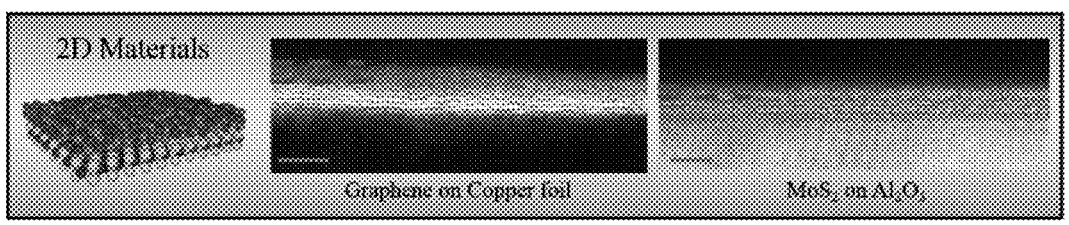
Figures 3G, 3H:
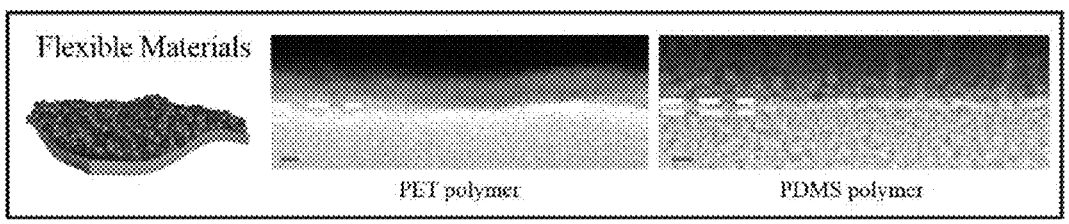

This is illustrated by the microphotographs of FIGS. 3a-3h, which depict eight cross sectional transmission electron microscopy (TEM) images of the ultrathin α-BN films grown on metals (copper foil in FIG. 3a & tungsten in FIG. 3b), insulators Al$_2$O$_3$ in FIG. 3c & SiO$_2$ in FIG. 3d), other 2D materials (graphene in FIG. 3e & MoS$_2$ in FIG. 3f), and polymer substrates (PET in FIG. 3g & PDMS in FIG. 3h). All films were synthesized at <200° C. without changing any of the α-BN deposition parameters (e.g., nitrogen pressure, working distance, laser power, etc. were kept the same), highlighting the versatility and ease of the deposition technique for growth on electrical conductors, insulators, and semiconductors.

Element specific plasma composition mapping as a function of both distance from the target and time after the laser pulse suggests that the predominant mechanism for formation of stoichiometric BN is the surface recombination of ionized B$^+$ and excited N* species generated at the laser ablated target surface. These particular species reach the substrate location before other species at 1-2 μs after the laser pulse, and their concentration was believed to be maximized with a background gas pressure of about 50 mTorr and a working distance of about 3 cm. Subsequently arriving species, such as molecular N2$^+$ and atomic N$^+$ ions that are formed due to the background gas decomposition and ionization do not believed to play a significant role in the formation of BN films. The arrival times, concentrations, plasma reactions, and surface growth uniformity are further tuned by optimization of laser power density and other processing parameters, including substrate rotation and beam scanning to facilitate a large area growth.

As discussed above, the dielectric layer 14 formed according to the method of the present disclosure has a thickness of less than 100 nm, preferably less than 20 nm, and most preferably less than 10 nm. Further still, the dielectric layer 14 according to the aforementioned method is principally made up of amorphous boron nitride (BN). Preferably, the dielectric layer 14 is made up of at least 90 mole percent amorphous boron nitride (α-BN), and more preferably, at least 95 mole percent amorphous boron nitride.

Example

The following, non-limiting example illustrates various additional aspects of the invention. Unless otherwise indicated, temperatures are in degrees Celsius and percentages are by weight based on the dry weight of the formulation.

In one example, growth of amorphous boron nitride (α-BN) films on a Si/SiO2 substrate was performed in an ultrahigh vacuum chamber, using a 248 nm Krypton Fluoride (KrF) laser at 1 Hz repetition rate, a laser power of 900 mJ per pulse, and spot size of 2.66 mm×1.5 mm, corresponding to a laser energy of 22.5 J/cm$^2$. Depositions were performed at a working distance of 3 cm with an amorphous boron nitride target and the chamber was filled with 99.9999% N2 gas at a pressure of 50 mTorr.

The dielectric and other properties of these (α-BN) films were then measured. To facilitate these measurements, tungsten films for bottom electrodes were grown in the same chamber with DC magnetron sputtering at a power of 40 W applied to the target, 2.5 mTorr of argon background pressure and an argon flow rate at 30 standard cubic centimeters per minute (sccm) on an SiO2/Si wafer. Titanium/gold contacts were also grown in a similar manner, with 40 W applied to the titanium and gold targets sequentially, and an argon pressure of 15 mTorr.

Chemical and Structural Analysis: X-ray photoelectron spectroscopy (XPS) was carried out using a Kratos AXIS Ultra spectrometer with a monochromatic Al Kα X-ray source (1486.6 eV) operated at 120 W (12 kV, 10 mA) and at approximately 4×10$^{-9}$ Torr. Survey scans were collected over the binding energy range of −5 to 1200 eV, in 1 eV steps, using a dwell time of 400 ms and analyzer pass energy of 160 eV. High resolution spectra of the B 1s and N 1s electron regions were acquired using an energy step size of 0.1 eV, a dwell time of 500 ms, and analyzer pass energy of 20 eV. XPS spectra were analyzed using the CasaXPS software. Peak areas were determined using a Shirley background subtraction. The binding energy was calibrated to Al 2p at 74.5 eV where sapphire was present and to Si 2p at 102.4 eV where PDMS was present. Using this data, it was determined that the boron nitride deposited in the dielectric layer was in amorphous form.

Cross-sectional transmission electron microscope (TEM) images of the BN thin films were also obtained using a FEI Nova focused ion beam (FIB) microscope equipped with an Omniprobe manipulator for lift out. The images obtained were similar to those shown in FIGS. 3a-3h of the present disclosure. Samples were also studied using a FEI Titan 80-300 S/TEM microscope operating at 300 kV, which was equipped with a Cs corrector for high-resolution imaging. In addition, cross-sectional microscopy was used in measuring film thickness.

Device Dielectric Characterization: Resistivities were measured using a Keithley 4200 analyzer with a thin gold filament to make contact onto a 40 μm×40 μm gold top electrode to facilitate the measurement. Dielectric permittivity characterizations were performed using a Novocontrol Alpha Analyzer. Scans were conducted at discrete frequencies, swept over the range of 10 Hz-1 MHz, at an AC driving voltage of 100 mV. The dielectric properties measured correspond to those listed in Table 1 above, for the ultrathin (α-BN) films.

As used herein and in the appended claims, the singular forms "a", "an" and "the" include plural reference unless the context clearly dictates otherwise. As well, the terms "a" (or "an"), "one or more" and "at least one" can be used interchangeably herein. It is also to be noted that the terms "comprising", "including", "characterized by" and "having" can be used interchangeably.

While the present invention has been illustrated by the description of one or more embodiments thereof, and while the embodiments have been described in considerable detail, they are not intended to restrict or in any way limit the scope of the appended claim to such detail. Additional advantages and modification will be readily apparent to those skilled in the art. The invention in its broader aspects is therefore not limited to the specific details, representative compositions, and methods and illustrative examples shown and described. Accordingly, departures may be made from such details without departing from the scope or the spirit of the general inventive concept exemplified herein.

What is claimed is:

1. A nanoelectronics structure comprising:
a substrate layer having at least a first surface and having a thickness of less than 100 nm; and
a dielectric layer deposited on the first surface of the substrate layer and having a thickness of less than 100 nm,
wherein the dielectric layer comprises at least 90 mole percent amorphous boron nitride and exhibits a bandgap from about 4.0 eV to about 5.0 eV.

2. The nanoelectronics structure of claim 1, wherein the dielectric layer comprises at least 95 mole percent amorphous boron nitride.

3. The nanoelectronics structure of claim 1, wherein the substrate layer has a thickness of less than 20 nm.

4. The nanoelectronics structure of claim 1, wherein the substrate layer comprises a material selected from the group consisting of silicon substrates, silicon oxide substrates, single-crystalline substrates, poly-crystalline substrates, polymer substrates, metal substrates, and two dimensional substrates.

5. The nanoelectronics structure of claim 1, wherein the substrate layer comprises a material selected from the group consisting of tungsten, copper, silicon dioxide ($SiO_2$), aluminum oxide ($Al_2O_3$), molybdenum disulfide ($MoS_2$), graphene, polyethylene terephthalate (PET), and polydimethylsiloxane (PDMS).

6. The nanoelectronics structure of claim 1, wherein the dielectric layer has a thickness of less than 20 nm.

7. The nanoelectronics structure of claim 1, wherein the dielectric layer has a thickness of less than 10 nm.

8. The nanoelectronics structure of claim 1, wherein the dielectric layer exhibits a dielectric constant from about 5.2 to about 6.6.

9. The nanoelectronics structure of claim 1, wherein the dielectric layer exhibits a bandgap from about 4.3 eV to about 4.7 eV.

10. A nanoelectronics structure comprising:
a substrate layer having at least a first surface and having a thickness of less than 20 nm; and
a dielectric layer deposited on the first surface of the substrate layer and having a thickness of less than 20 nm,
wherein the substrate layer comprises a two-dimensional substrate material selected from the group consisting of molybdenum disulfide ($MoS_2$) and graphene, and
wherein the dielectric layer comprises at least 90 mole percent amorphous boron nitride.

* * * * *